(12) United States Patent
Lu et al.

(10) Patent No.: US 12,707,927 B2
(45) Date of Patent: Aug. 11, 2026

(54) PHOTOMASK BOX CARRYING DEVICE

(71) Applicant: Gudeng Equipment Co., LTD., New Taipei City (TW)

(72) Inventors: Yi-Xuan Lu, Tainan City (TW); Fang-Yin Jhu, Kaohsiung City (TW); Wei-Yun Chen, Hsinchu County (TW); Ming-Mo Lo, Hsinchu County (TW); Hung-Che Lai, Tainan City (TW); Lin-Hsin Tu, Hsinchu City (TW)

(73) Assignee: Gudeng Equipment Co., LTD., New Taipei City (TW)

( * ) Notice: Subject to any disclaimer, the term of this patent is extended or adjusted under 35 U.S.C. 154(b) by 202 days.

(21) Appl. No.: 18/882,725

(22) Filed: Sep. 11, 2024

(65) Prior Publication Data

US 2025/0379079 A1 Dec. 11, 2025

(30) Foreign Application Priority Data

Jun. 6, 2024 (TW) ................................ 113120984

(51) Int. Cl.

| | |
|---|---|
| ***H10P 72/10*** | (2026.01) |
| ***G03F 1/66*** | (2012.01) |
| ***G03F 7/00*** | (2006.01) |
| ***H10P 72/30*** | (2026.01) |

(52) U.S. Cl.
CPC ............ *H10P 72/1906* (2026.01); *G03F 1/66* (2013.01); *G03F 7/70741* (2013.01); *H10P 72/30* (2026.01)

(58) Field of Classification Search
None
See application file for complete search history.

(56) References Cited

U.S. PATENT DOCUMENTS

| | | | | |
|---|---|---|---|---|
| 2010/0078433 | A1* | 4/2010 | Mizukoshi .......... | H10P 72/1906 220/200 |
| 2017/0052460 | A1* | 2/2017 | Yoneda ............... | G03F 7/70733 |

* cited by examiner

*Primary Examiner* — Kristy A Haupt
(74) *Attorney, Agent, or Firm* — Winston Hsu

(57) ABSTRACT

A photomask box carrying device is applied to a target box with first standard or second standard. The photomask box carrying device includes a substrate, a base, a plurality of carrying components, a rotary component and a clamping component. The base is movably disposed on the substrate. The plurality of carrying components is disposed around the base and adapted to carry the target box. Position of the plurality of carrying components on the base correspond to an overlapped area of a first carrying area of the target box with the first standard and a second carrying area of the target box with the second standard. The rotary component is disposed under the base to adjust levelness of the base relative to the substrate. The clamping component is disposed on the substrate and adapted to abut a lateral side of the target box.

12 Claims, 5 Drawing Sheets

PHOTOMASK BOX CARRYING DEVICE

BACKGROUND OF THE INVENTION

1. Field of the Invention

The present invention relates to a photomask box carrying device, and more particularly, to a photomask box carrying device shared for a target box with different standard.

2. Description of the Prior Art

A conventional photomask carrying mechanism is only used to carry and clamp the photomask box, and cannot be applied for the photomask box made by different manufacturers. The conventional photomask carrying mechanism includes a base portion, a carrying portion and a clamping portion. The carrying portion is extended outwardly from the base portion. The clamping portion is movably disposed on the base portion and adjacent to the carrying portion. When the photomask box is placed on the carrying portion, lateral sides of the photomask box are clamped by the clamping portion to place the photomask box on the carrying portion for subsequent process. If the photomask box made by other manufacturer is intended to use, another conventional photomask carrying mechanism that is matched with the photomask box made by other manufacturer is needed for executing foresaid steps so as to clamp the photomask box with different standard. The conventional photomask carrying mechanism is only suitable for the photomask box with specific standard, and has a disadvantage of inconvenient user and expensive hardware cost. Therefore, design of a photomask box carrying device shared for the photomask box with different standard is an important issue in the related mechanism design industry.

SUMMARY OF THE INVENTION

The present invention provides a photomask box carrying device shared for a target box with different standard for solving above drawbacks.

According to the claimed invention, a photomask box carrying device is suitable for a target box with first standard or second standard. The photomask box carrying device includes a substrate, a base, a plurality of carrying components, a rotary component and a clamping component. The base is movably disposed on the substrate. The plurality of carrying components is disposed around the base and adapted to carry the target box; position of the plurality of carrying components on the base corresponds to an overlapped area of a first carrying area of the target box with the first standard and a second carrying area of the target box with the second standard. The rotary component is disposed under the base and adapted to adjust levelness of the base relative to the substrate. The clamping component is disposed on the substrate and adapted to abut against a lateral side of the target box.

According to the claimed invention, the photomask box carrying device further includes at least one bridging component, and two ends of the bridging component are respectively fixed onto the substrate and movably connected to the base. The photomask box carrying device further includes a sensor disposed on the base and adjacent to the plurality of carrying components, and adapted to detect whether the target box is put on the plurality of carrying components. The photomask box carrying device further includes a driver electrically connected to the sensor and the clamping component, and adapted to change position of the clamping component relative to the target box. The photomask box carrying device further includes a plurality of constraining components disposed on the base and adjacent to the plurality of carrying components.

The photomask box carrying device of the present invention can design the carrying components that align with the overlapped area of the target boxes with different standard, so that the photomask box carrying device can be applied for the photomask box made by different manufacturers. In addition, the rotary component can be optionally disposed between the substrate and the base for levelness adjustment of the photomask box; the constraining component can be applied for covering outer sizes of the target boxes with different standard, and the clamping component can be moved by the driver to push the target box to abut against the constraining component for the constraint; the sensor can detect whether the target box is put on the carrying component and the constraining component. As long as the target box is put on the photomask box carrying device, the sensor can automatically activate the driver when detecting existence of the target box, and the photomask box carrying device of the present invention can be fully compatible with the target boxes with different standard.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
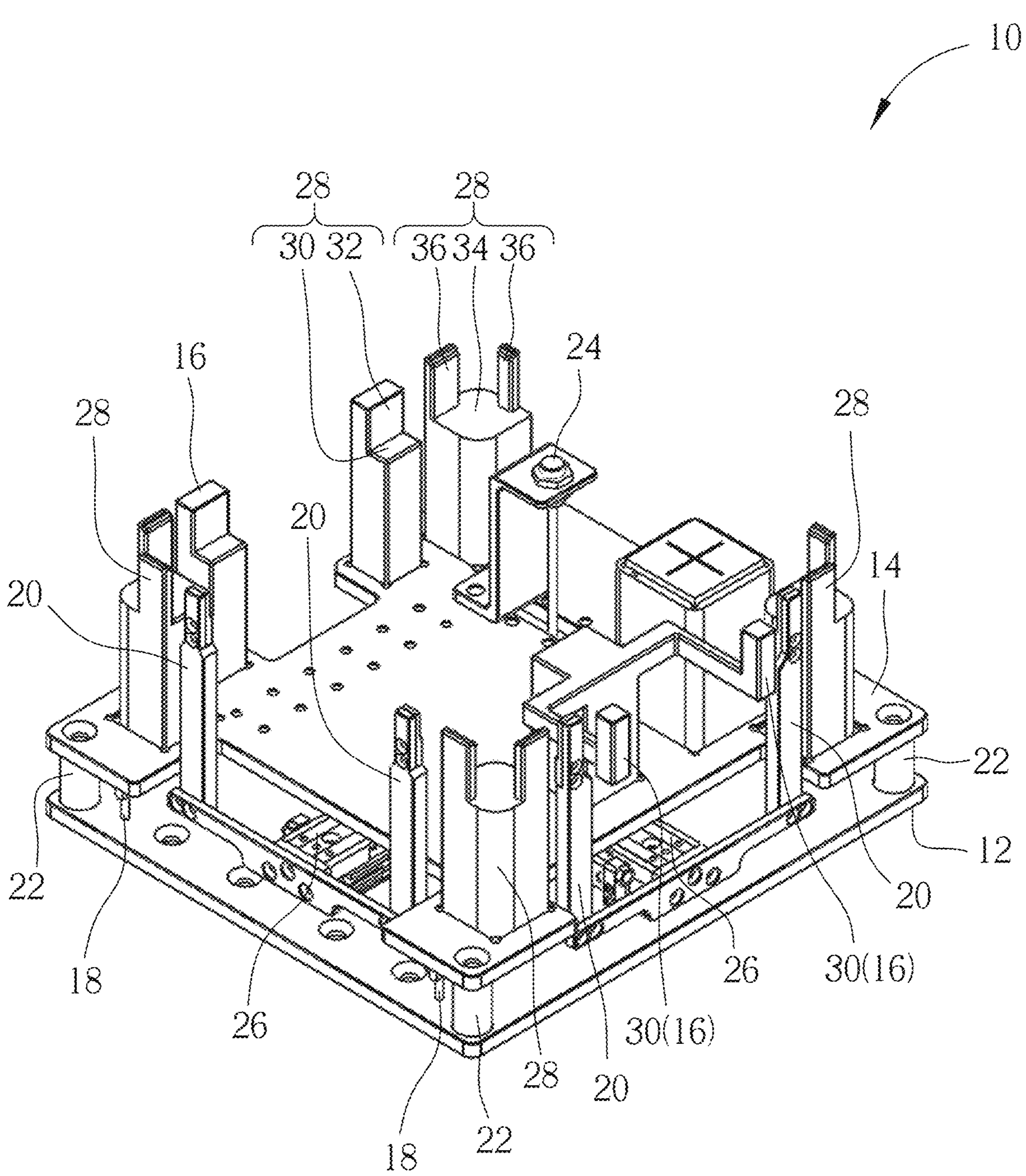
FIG. 1 and FIG. 2 are diagrams of a photomask box carrying device according to different embodiments of the present invention.
Figure 2:
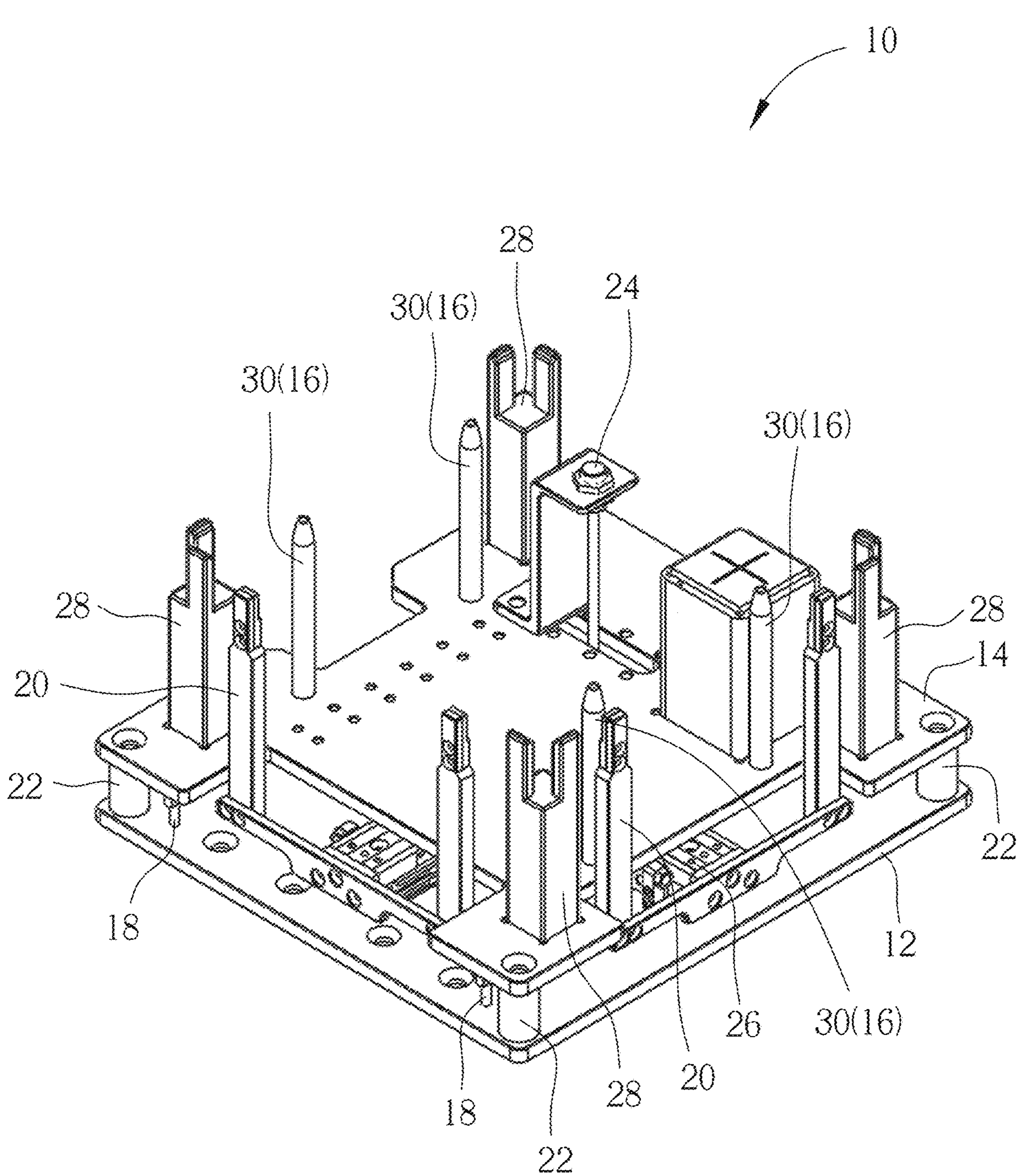
Figure 3:
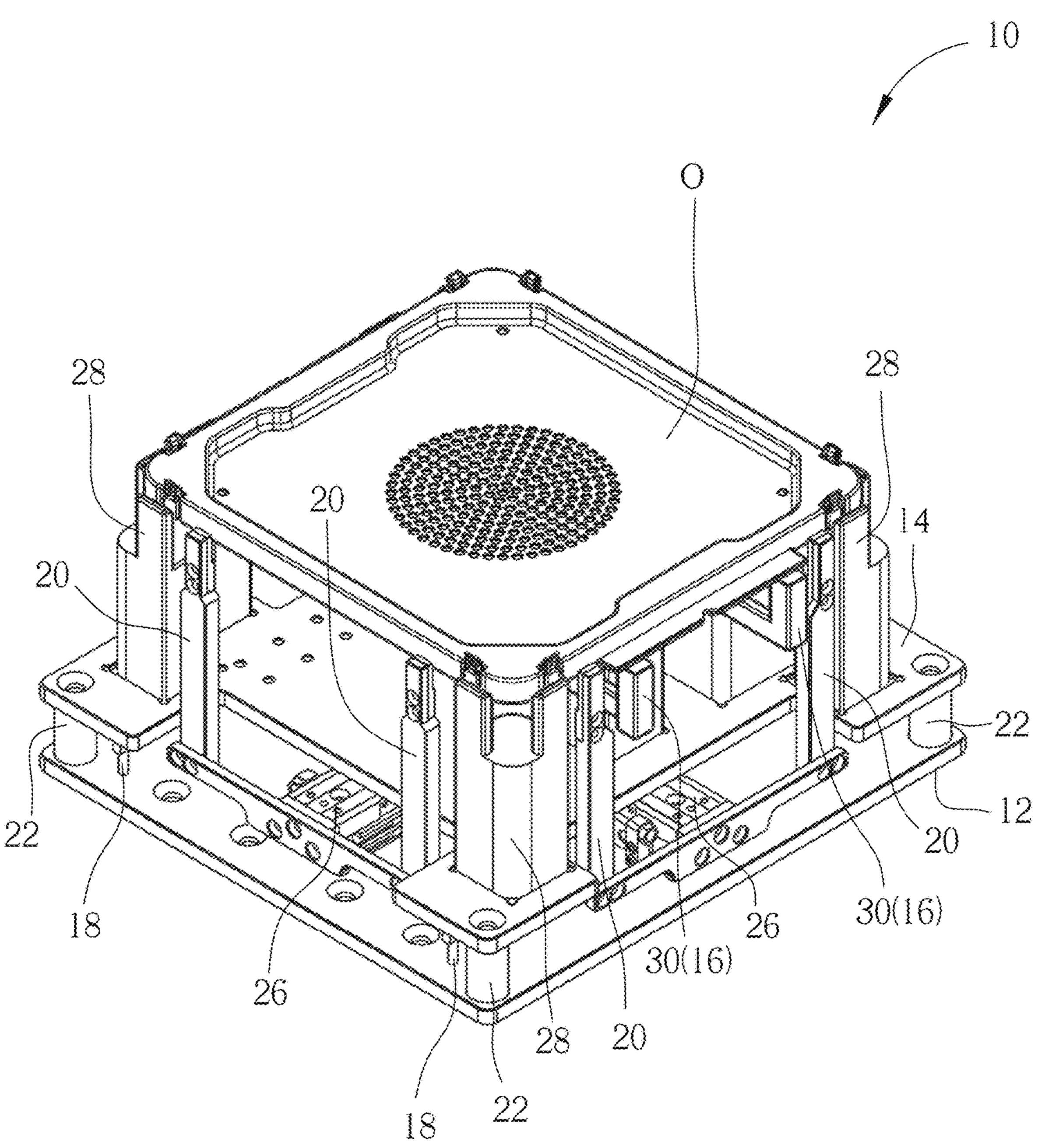
FIG. 3 and FIG. 4 are diagrams of the photomask box carrying device and a target box according to different embodiments of the present invention.
Figure 4:
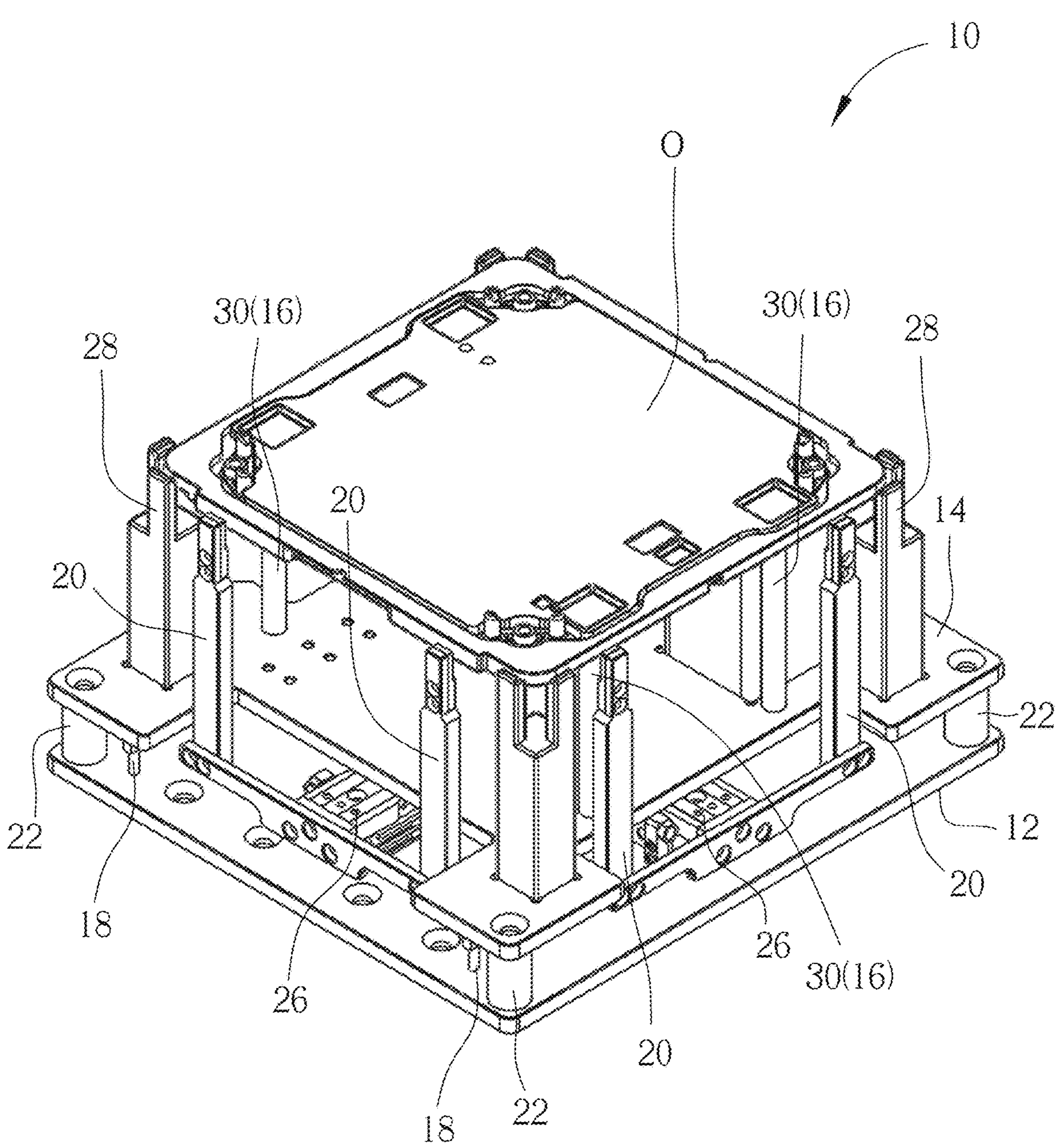

Please refer to FIG. 1 to FIG. 4. FIG. 1 and FIG. 2 are diagrams of a photomask box carrying device 10 according to different embodiments of the present invention. FIG. 3 and FIG. 4 are diagrams of the photomask box carrying device 10 and a target box O according to different embodiments of the present invention. The photomask box carrying device 10 can be applied for the target box O where on the photomask is disposed. The target box O can include an upper cover and a lower cover, types of the upper cover and the lower cover can be shown in FIG. 3 and FIG. 4. The present invention can provide the photomask box carrying device 10 shown in FIG. 1 suitable for the upper cover of the target box O, and further provide the photomask box carrying device 10 shown in FIG. 2 suitable for the lower cover of the target box O. It should be mentioned that the photomask box carrying device 10 shown in FIG. 1 may be optionally varied to apply for the lower cover of the target box O, and the photomask box carrying device 10 shown in FIG. 2 may be optionally varied to apply for the upper cover of the target box O; variation of the photomask box carrying device 10 can depend on a design demand.

Figure 5:
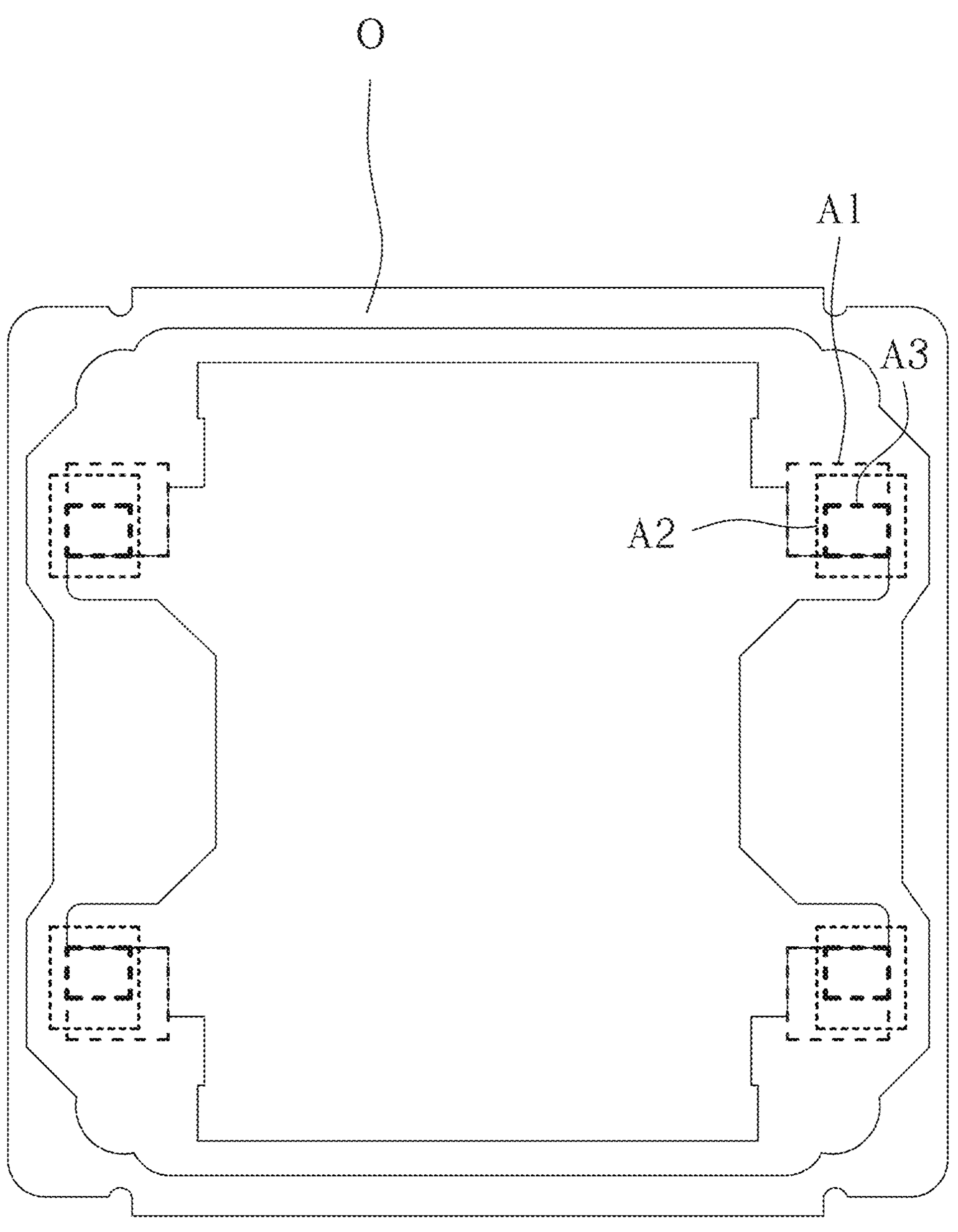
FIG. 5 is an overlapped diagram of the target boxes with different standard according to the embodiment of the present invention.

The photomask box carrying device 10 can be applied to the target boxes O with different standard, and a number of the foresaid target boxes O can be two or more. The present invention takes the photomask box carrying device 10 applied for two target boxes O with different standard as an example, such as the upper cover and the lower cover of the photomask box; practical application of the target box O is not limited to the foresaid embodiment. Please refer to FIG. 5. FIG. 5 is an overlapped diagram of the target boxes O with different standard according to the embodiment of the present invention. As shown in FIG. 5, the target box O with first standard can have a first carrying area A1, and the target box O with second standard can have a second carrying area A2. The universal range of the first carrying area A1 and the second carrying area A2 can belong to a common non-contaminated area that is defined as an overlapped area A3, and a function of the target box O is not affected if the overlapped area A3 is touched by any external element.

The photomask box carrying device 10 can at least include a substrate 12, a base 14, a carrying component 16, a rotary component 18, a clamping component 20, a bridging component 22, a sensor 24, a driver 26 and a constraining component 28. Two ends of the bridging component 22 can be respectively fixed onto the substrate 12 and movably connected to the base 14, so that the base 14 can be moved relative to the substrate 12. For example, the rotary component 18 can be disposed under the base 14, and used to adjust levelness of the base 14 relative to the substrate 12. The rotary component 18 can be a level adjustment screw disposed between the substrate 12 and the base 14, or any component with similar functions. Generally, the photomask box carrying device 10 may dispose the bridging components 22 respectively on four corners of the substrate 12 and/or the base 14; a number and position of the bridging component 22 are not limited to the foresaid embodiment, and depend on the design demand.

A plurality of carrying components 16 can be respectively disposed around the base 14, and used to carry the target box O with the first standard or with the second standard. Position of the plurality of carrying component 16 on the base 14 can correspond to the overlapped area A3 of the first carrying area A1 and the second carrying area A2. In the present invention, each carrying component 16 can at least include a supporting portion 30 used to abut against the overlapped area A3, such as the two carrying components 16 on the right shown in FIG. 1 and the four carrying components 16 shown in FIG. 2. In other possible embodiment, each carrying component 16 can further include a covering portion 32 connected to the supporting portion 30 and adapted to abut against a lateral side of the target box O, such as the two carrying components 16 on the left shown in FIG. 1. A shape, a number and position of the carrying component 16 are not limited to the foresaid embodiment, and depend on the design demand.

The clamping component 20 can be disposed on position of the substrate 12 different from and interlaced with the position of the plurality of carrying components 16, and electrically connected to the sensor 24 and the driver 26. The clamping component 20 can be used to abut against the lateral side of the target box O that is the same as or different from ones abut by the carrying component 16. The sensor 24 can be disposed on the base 14 and adjacent to the plurality of carrying components 16, and used to detect whether the target box O is put on the plurality of carrying components 16. The driver 26 can be disposed on the substrate 12, and used to change position of the clamping component 20 relative to the target box O. When the sensor 24 detects that the target box O is put on the plurality of carrying components 16, the driver 26 can be activated to move the clamping component 20 to tightly abut against the target box O for constraint. A number and position of the clamping component 20 are not limited to the foresaid embodiment, and depend on the design demand.

The constraining component 28 can be disposed on the base 14 and adjacent to the plurality of carrying components 16. The constraining components 28 may be disposed on four corners of the substrate 12 and/or the base 14. A number and position of the constraining component 28 are not limited to the foresaid embodiment, and depend on the design demand. The constraining component 28 can include a holding portion 34 and a blocking portion 36. A distance of the holding portion 34 relative to the base 14 can be the same as a distance of the supporting portion 30 relative to the base 14, and therefore the target box O can be carried both by the constraining component 28 and the carrying component 16. A number of the blocking portion 36 can be plural, and the blocking portions 36 can be respectively disposed on different lateral sides of the holding portion 34 for constraining a movement of the target box O in multiple directions.

In conclusion, the photomask box carrying device of the present invention can design the carrying components that align with the overlapped area of the target boxes with different standard, so that the photomask box carrying device can be applied for the photomask box made by different manufacturers. In addition, the rotary component can be optionally disposed between the substrate and the base for levelness adjustment of the photomask box; the constraining component can be applied for covering outer sizes of the target boxes with different standard, and the clamping component can be moved by the driver to push the target box to abut against the constraining component for the constraint; the sensor can detect whether the target box is put on the carrying component and the constraining component. As long as the target box is put on the photomask box carrying device, the sensor can automatically activate the driver when detecting existence of the target box, and the photomask box carrying device of the present invention can be fully compatible with the target boxes with different standard.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photomask box carrying device suitable for a target box with first standard or second standard, the photomask box carrying device comprising:

a substrate;

a base movably disposed on the substrate;

a plurality of carrying components disposed around the base and adapted to carry the target box, position of the plurality of carrying components on the base corresponding to an overlapped area of a first carrying area of the target box with the first standard and a second carrying area of the target box with the second standard;

a rotary component disposed under the base and adapted to adjust levelness of the base relative to the substrate; and a clamping component disposed on the substrate and adapted to abut against a lateral side of the target box.

2. The photomask box carrying device of claim 1, wherein the photomask box carrying device further comprises at least one bridging component, two ends of the bridging component are respectively fixed onto the substrate and movably connected to the base.

3. The photomask box carrying device of claim 1, wherein each of the plurality of carrying components comprises a supporting portion adapted to abut against the overlapped area.

4. The photomask box carrying device of claim 3, wherein the carrying component further comprises a covering portion connected to the supporting portion and adapted to abut against another lateral side of the target box.

5. The photomask box carrying device of claim 1, wherein the rotary component is a level adjustment screw disposed between the substrate and the base.

6. The photomask box carrying device of claim 1, wherein the clamping component is disposed on position different from the position of the plurality of carrying components.

7. The photomask box carrying device of claim 1, wherein the photomask box carrying device further comprises a sensor disposed on the base and adjacent to the plurality of carrying components, and adapted to detect whether the target box is put on the plurality of carrying components.

8. The photomask box carrying device of claim 7, wherein the sensor is electrically connected to the clamping component, and adapted to drive the clamping component to abut against the target box when detecting the target box put on the plurality of carrying components.

9. The photomask box carrying device of claim 7, wherein the photomask box carrying device further comprises a driver electrically connected to the sensor and the clamping component, and adapted to change position of the clamping component relative to the target box.

10. The photomask box carrying device of claim 1, wherein the overlapped area is a common non-contaminated area of the target box with the first standard and the target box with the second standard.

11. The photomask box carrying device of claim 1, wherein the photomask box carrying device further comprises a plurality of constraining components disposed on the base and adjacent to the plurality of carrying components.

12. The photomask box carrying device of claim 11, wherein each of the plurality of constraining components comprises a holding portion and two blocking portions, the two blocking portions are respectively disposed on two different lateral sides of the holding portion.

* * * * *